United States Patent
Miller, Jr. et al.

[11] Patent Number: 5,329,176
[45] Date of Patent: Jul. 12, 1994

[54] SELF-TIMED CLOCKING SYSTEM AND METHOD FOR SELF-TIMED DYNAMIC LOGIC CIRCUITS

[75] Inventors: Robert H. Miller, Jr., Loveland; Jeffry D. Yetter; Glenn T. Colon-Bonet, both of Ft. Collins; Robert J. Martin, Timnath, all of Colo.

[73] Assignee: Hewlett-Packard Company, Palo Alto, Calif.

[21] Appl. No.: 137,902

[22] Filed: Sep. 29, 1993

Related U.S. Application Data

[63] Continuation of Ser. No. 886,000, May 19, 1992, abandoned, which is a continuation-in-part of Ser. No. 684,720, Apr. 12, 1991, Pat. No. 5,208,490.

[51] Int. Cl.⁵ .......................................... H03K 19/017
[52] U.S. Cl. ..................................... 307/443; 307/452; 307/481
[58] Field of Search ............... 307/443, 452, 465, 481; 364/761

[56] References Cited

U.S. PATENT DOCUMENTS

| | | | |
|---|---|---|---|
| 4,570,084 | 2/1986 | Griffin et al. ...................... | 307/452 |
| 4,700,086 | 10/1987 | Ling et al. ........................ | 307/452 X |
| 4,700,088 | 10/1987 | Tubbs ............................... | 307/443 X |
| 4,841,174 | 6/1989 | Chang et al. ..................... | 307/443 X |
| 4,858,167 | 8/1989 | Simpson et al. .................. | 364/787 |
| 4,985,643 | 1/1991 | Proebsting ........................ | 307/443 |
| 5,008,569 | 4/1991 | Roy .................................. | 307/481 X |
| 5,128,891 | 7/1992 | Lynch et al. ..................... | 364/767 |

Primary Examiner—David R. Hudspeth

[57] ABSTRACT

A clocking system and method are provided for logic blocks having cascaded self-timed dynamic logic gates. The dynamic logic gates are precharged in parallel and collectively perform self-timed logic evaluation on vector inputs to derive a vector output. An evaluation done detector monitors the output of the logic block and determines when the vector output is valid. An edge detector detects the rising and falling edges of an arbitrary periodic timing signal. Finally, a logic block clock generator is set by the edge detector and reset by the evaluation done detector so as to provide precharging signals to the logic block, thereby defining respective precharge periods, and to provide evaluation periods for the self-timed logic evaluations in the logic block. In a specific implementation, the speed of logic evaluations is twice the speed of the system clock.

29 Claims, 11 Drawing Sheets

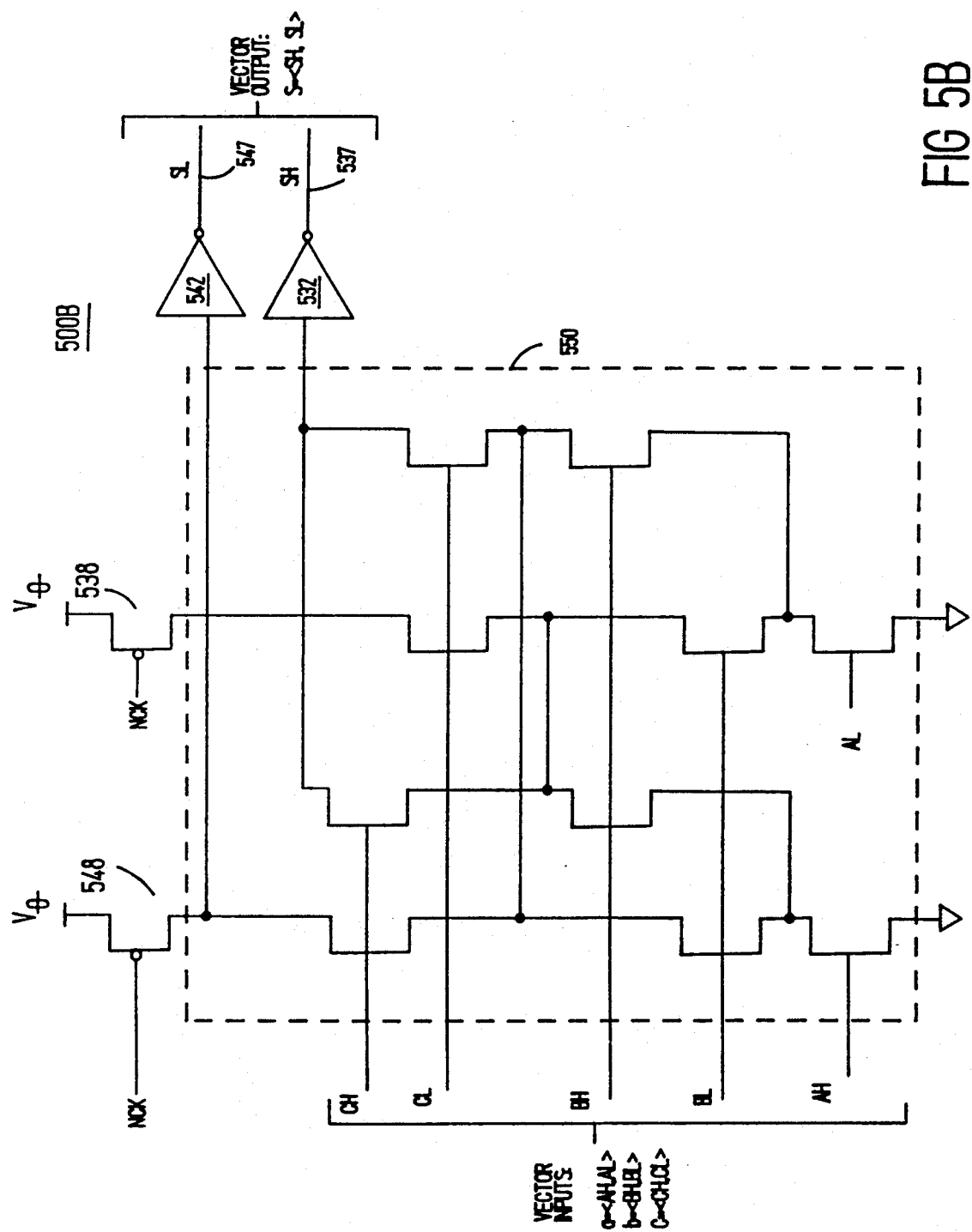

SELF-TIMED CLOCKING SYSTEM AND METHOD FOR SELF-TIMED DYNAMIC LOGIC CIRCUITS

CROSS REFERENCE TO RELATED APPLICATION

This is a continuation of copending application Ser. No. 07/886,000, filed on May 19, 1992, now abandoned, which is a continuation-in-part of "A FUNCTIONALLY COMPLETE FAMILY OF SELF-TIMED LOGIC CIRCUITS" by Jeffry Yetter, filed Apr. 12, 1991, having application Ser. No. 07/684,720, now U.S. Pat. No. 5,208,490.

CROSS-REFERENCE TO RELATED APPLICATIONS

1. "A FUNCTIONALLY COMPLETE FAMILY OF SELF-TIMED LOGIC CIRCUITS" by Jeffry Yetter, filed Apr. 12, 1991, having application Ser. No. 07/684,720; and
2. "UNIVERSAL PIPELINE LATCH FOR MOUSETRAP LOGIC CIRCUITS" by Jeffry Yetter, filed Apr. 12, 1991, having application Ser. No. 07/684,637.

BACKGROUND OF THE INVENTION

1. Field of the Invention

The present invention relates generally to dynamic logic in computers and, more particularly, to a system and method for clocking logic blocks having cascaded self-timed dynamic logic gates, for example, "mousetrap" logic gates.

2. Related Art

Recently, a functionally complete family of self-timed dynamic logic gates was developed by Jeffry Yetter of Hewlett-Packard Company, Fort Collins, Colo., U.S.A. These self-timed dynamic logic gates were configured to implement a vector logic system. In the proposed vector logic system, more than two valid logic states are propagated through the logic. Furthermore, by using a precharge on the mousetrap logic gates, a monotonic progression of logic evaluations is implemented.

In a monotonic progression, only one direction of logic transition is considered. For example, in mousetrap logic gates, only the logic transition from a logic low to a logic high is considered, not the logic transition from a logic high to a logic low. As a result of the implementation of a monotonic progression, problems associated with static hazards are eliminated.

Furthermore, because a vector logic state in the present invention is encoded in a physical way which allows for an invalid state and because dynamic precharging is implemented, outputs from a mousetrap logic block, comprising one or more cascaded mousetrap logic gates, may be "self-timed," or configured to operate asynchronously with respect to the clock source providing the precharge signals. In other words, clocks or other charging signals are used to merely precharge the mousetrap logic gates; the clocks do not dictate progression of the logic evaluation through the cascaded mousetrap logic gates. Triggering of each individual mousetrap logic gate is accomplished by a successful logic evaluation performed by the corresponding logic associated with the mousetrap logic gate. Hence, when using the vector logic system with mousetrap logic gates, two significant features can be determined from each vector output: (1) when the vector output is valid, thereby eliminating the need for a conventional valid clock signal, and (2) the value of the vector output when it is valid.

When mousetrap logic gates are cascaded in series, a vector input will proceed through the gates in a self-timed manner. Each successive gate will perform a logic evaluation on its corresponding vector inputs when the gate determines them to be valid. Moreover, the cascaded mousetrap logic gates can be precharged in parallel by a clock and then permitted to perform logic evaluations on the vectors. However, the clocking system must be configured to permit enough time for the logic evaluations to proceed entirely through the cascaded network. Further, the clocking system must be configured to permit enough time for all cascaded gates to precharge. As a result of the foregoing requirements, the vector output of the cascaded gates must oftentimes wait for a clock edge before it can proceed to another mousetrap logic block. Thus, much time is wasted.

Consequently, a need exists for a self-timed clocking system and method for optimally exploiting the self-timed nature of mousetrap logic gates and any other dynamic logic gates which have self-timed attributes.

SUMMARY OF THE INVENTION

The present invention optimizes the speed of logic evaluations occurring in logic blocks comprised of cascaded self-timed dynamic logic gates. The present invention has particular applicability to a family of self-timed dynamic logic gates known as "mousetrap" logic gates.

In a first embodiment of the present invention, a logic block has cascaded dynamic logic gates which are precharged in parallel and which can collectively perform self-timed logic evaluations on vector inputs to derive a vector output. An evaluation done detector monitors the output of the logic block and is configured to determine when the vector output is valid. Finally, a logic block clock generator is set by a triggering signal and reset by the evaluation done detector. The logic block clock generator is adapted to provide precharging signals to the logic block, thereby defining respective precharge periods, and to provide evaluation periods for the self-timed logic evaluations in the logic block.

The operation of the first embodiment is as follows. First, a precharge is initiated to thereby arm the cascaded self-timed dynamic logic gates in parallel. The cascaded self-timed dynamic logic gates are then permitted to perform logic evaluations on vector inputs to derive a vector output. When the vector output is determined to be valid by the evaluation done detector, another precharge of the cascaded self-timed logic gates is immediately initiated.

A second embodiment of the present invention has all of the same components of the first embodiment and similar methodology, except that the second embodiment further comprises a precharge done detector for generating the triggering signal which sets the logic block clock generator. Thus, operation in the second embodiment is totally self-timed and asynchronous with respect to any other clock source, including the system clock.

Further features and advantages of the present invention will become apparent to one skilled in the art upon examination of the following drawings and the detailed description.

BRIEF DESCRIPTION OF THE DRAWINGS

The present invention, as defined in the claims, can be better understood with reference to the text and to the following drawings.

FIG. 5B illustrates a low level block diagram of a three-input exclusive OR mousetrap logic gate in accordance with FIG. 5A;

DETAILED DESCRIPTION OF THE PREFERRED EMBODIMENT

Table of Contents

Figure 1:
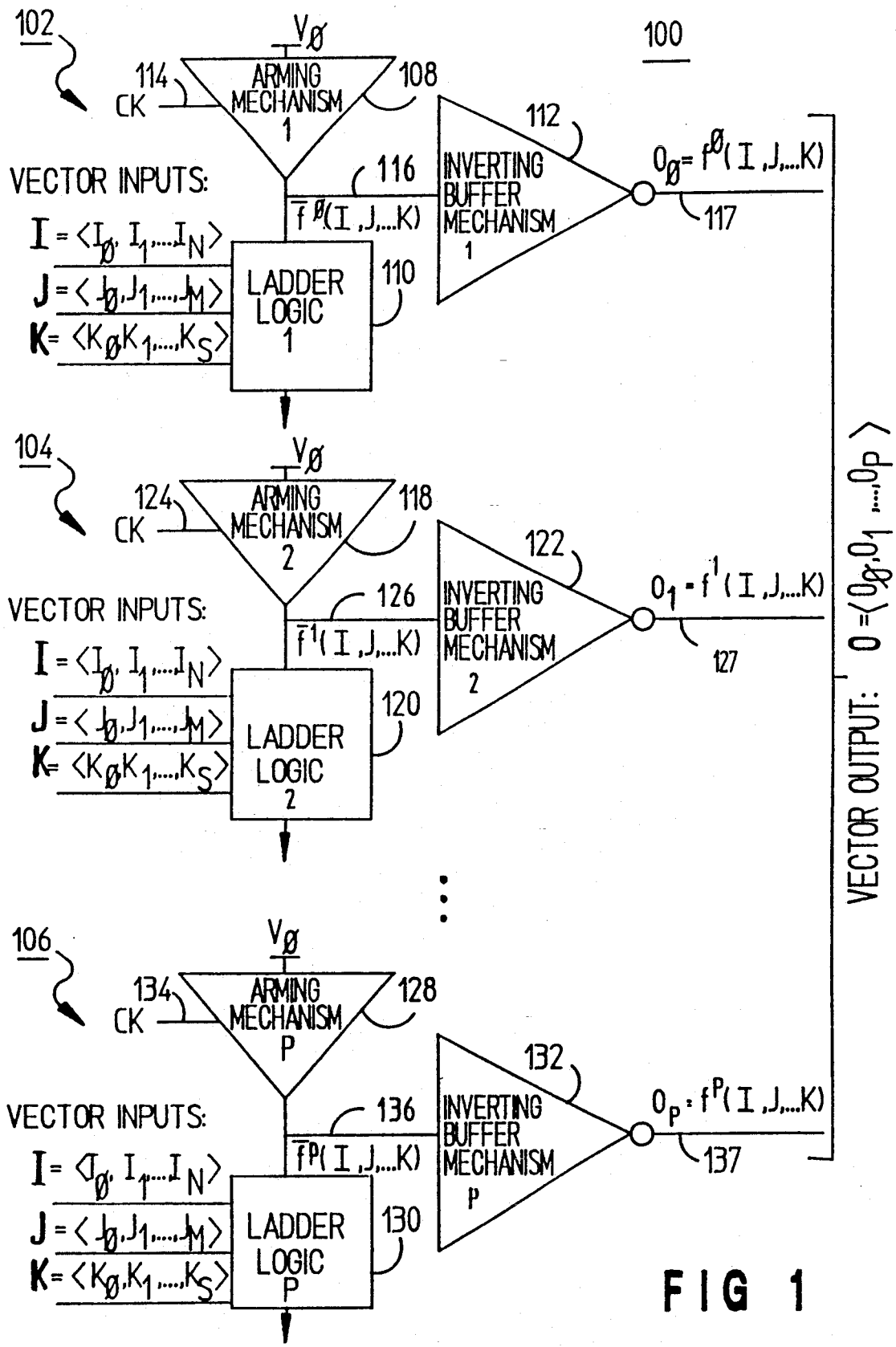
FIG. 1 illustrates a high level block diagram of a family of dynamic logic gates, called "mousetrap" logic gates, which can be pipelined in accordance with the present invention.

I. Logic System
  A. Vector Logic
  B. Mousetrap Logic Gates
    1. Architecture
    2. Operation
    3. Inclusive OR Gate
    4. Add Predecoder Gate
    5. Carry Propagate Gate
    6. Shared Ladder Logic
    7. Exclusive OR Gates
II. Self-Timed Clocking System
  A. First Embodiment
  B. Second Embodiment

I. Logic System

The present invention is essentially directed to, among other things, a system and method for clocking mousetrap logic blocks having cascaded self-timed dynamic logic gates, for example but not limited to, "mousetrap" logic gates. Mousetrap logic gates are the subject matter focused upon in parent application Ser. No. 07/684,720 entitled "A FUNCTIONALLY COMPLETE FAMILY OF SELF-TIMED LOGIC CIRCUITS" filed Apr. 12, 1991. For a clear understanding of the present invention, a brief discussion follows in regard to mousetrap logic gates.

A. Vector Logic

Typically, logic in a computer is encoded in binary fashion on a single logic path, which is oftentimes merely an electrical wire or semiconductor throughway. By definition, a high signal level, usually a voltage or current, indicates a high logic state (in programmer's language, a "1"). Moreover, a low signal level indicates a low logic state (in programmer's language, a "0").

The present invention envisions implementing "vector logic" by cascading mousetrap gates. Vector logic is a logic configuration where more than two valid logic states may be propagated through the logic gates in a computer. Unlike conventional binary logic having two valid logic states (high, low) defined by one logic path, the vector logic of the present invention dedicates more than one logic path for each valid logic state and permits an invalid logic state.

For example, in accordance with one embodiment, in a vector logic system requiring two valid logic states, two logic paths are necessary. when both logic paths are at a logic low, i.e., "0,0" an invalid logic state exists by definition. Moreover, a logic high existing exclusively on either of the two logic paths, i.e., "1,0" or "0,1", corresponds with the two valid logic states of the vector logic system. Finally, the scenario when both logic paths are high, i.e., "1,1", is an undefined logic state in the vector logic system.

In a vector logic system requiring three logic states in accordance with another embodiment, three logic paths would be needed, and so on. In conclusion, in accordance with the foregoing embodiment, a vector logic system having n valid logic states and one invalid state comprises n logic paths.

Furthermore, encoding of vector logic states could be handled by defining a valid vector logic state by a logic high on more than one logic path, while still defining an invalid state when all paths exhibit a low logic signal. In other words, the vector logic states are not mutually exclusive.

For example, in a vector logic system using a pair of logic highs to define each valid vector logic state, the following logic scheme could be implemented. With three logic paths, "0,1,1" could designate a vector logic state 1, "1,0,1" a vector logic state 2, and "1,1,0" a vector logic state 3. With four logic paths, six valid vector logic states could be specified. Specifically, , , , "0,0,1,1" could designate a vector logic state 1, , , , "0,1,0,1" a vector logic state 2, "1,0,0,1" a vector logic state 3, "0,1,1,0" could designate a vector logic state 4, "1,0,1,0" a vector logic state 5, and "1,1,0,0" a vector logic state 6. With five logic paths up to ten valid vector logic states could be specified, and so on.

As another example, a vector logic system could be derived in accordance with the present invention wherein three logic highs define each valid vector logic state. n conclusion, as is well known in the art, the above vector schemes can be summarized by a mathematical combination formula. The combination formula is as follows:

$$i = \binom{n}{m} = \frac{n!}{m!(n-m)!}$$

where variable n is the number of logic paths (vector components), variable m is the number of logic paths which define a valid vector logic state (i.e., the number of logic paths which must exhibit a logic high to specify a particular vector logic state), and variable i is the number of possible vector logic states.

B. Mousetrap. Logic Gates

FIG. 1 illustrates a high level block diagram of a family of "mousetrap" logic gates in accordance with the present invention. Mousetrap logic gates, described in detail hereinafter, can implement vector logic at high speed, are functionally complete, are self-timed, and do not suffer adverse logic reactions resulting from static hazards when chained in a sequence of stages.

As shown in FIG. 1, each input to the mousetrap logic gate 100 of the present invention is a vector, denoted by vector inputs I, J, ..., K (hereinafter, vectors variables are in bold print). No limit exists as to the number of vector inputs I, J, ..., K. Further, each of vector inputs I, J, ..., K may be specified by any number of vector components, each vector component having a dedicated logic path denoted respectively in FIG. 1 by $I_O-I_N$, $J_O-J_M$, and $K_O-K_S$.

Essentially, each vector input specifies a vector logic state. As mentioned previously, an invalid vector logic state for any of the input vectors I, J, ..., K is present by definition when all of its corresponding vector components, respectively, $I_O-I_N$, $J_O-J_M$, and $K_O-K_S$, are at a logic low.

The output of the generic mousetrap logic gate 100 is also a vector, denoted by a vector output O. The vector output O is comprised of vector components $O_O-O_P$. The vector components $O_O-O_P$ are mutually exclusive and are independent functions of the vector inputs I, J, ..., K. Further, the vector components $O_O-O_P$ have dedicated mousetrap gate components 102-106, respectively, within the mousetrap logic gate 100. By definition in the present invention, one and only one of $O_O-O_P$ is at a logic high at a any particular time.

Moreover, no limit exists in regard to the number of vector components $O_O-OP$ which can be associated with the output vector O. The number of vector components $O_O-O_P$ and thus mousetrap gate components 102-106 depends upon the logic function to be performed on the vector inputs individually or as a whole, the number of desired vector output components, as well as other considerations with respect to the logical purpose of the mousetrap logic gate 100.

1. Architecture

With reference to FIG. 1, each mousetrap gate component 102-106 of the mousetrap logic gate 100 comprises an arming mechanism 108, ladder logic 110, and an inverting buffer mechanism 112. The arming mechanism 108 is a precharging means, or energizing means, for arming and resetting the mousetrap logic gate 100.

The arming mechanism 108 essentially serves as a switch to thereby selectively impose a voltage $V_O$ defining a logic state on a line 116 upon excitation by a clock signal (high or low) on line 114. As known in the art, any type of switching element or buffer for selectively applying voltage based upon a clock signal can be used. Furthermore, when the logic of a computer system is based upon current levels, rather than voltage levels, then the arming mechanism 108 could be a switchable current source, which is also well known in the art. Any embodiment serving the described switching function as the arming mechanism 108 is intended to be incorporated herein.

The ladder logic 110 is designed to perform a logic function on the vector inputs I, J, ..., K. The ladder logic 110 corresponding to each mousetrap gate component 102-106 may vary depending upon the purpose of each mousetrap gate component 102-106. In the preferred embodiment, the ladder logic 110 is essentially a combination of simple logic gates, for example, logic OR gates and/or logic AND gates, which are connected in series and/or in parallel. It should be noted that the ladder logic 110 is configured in the present invention so that one and only one of the vector output components $O_O-O_P$ is at a logic high at any sampling of a valid vector output 0. Specific implementations of the ladder logic 110 are described below in regard to the illustrations of FIGS. 2-5.

The ladder logic 110 must operate at high speed because it resides in the critical logic path, unlike the arming mechanism 108 which initially acts by arming the mousetrap gate component, but then sits temporarily dormant while data actually flows through the mousetrap gate component, i.e., through the critical logic path. Furthermore, because the ladder logic 110 resides in the critical logic path which is essentially where the logical intelligence is positioned, a plurality of logic gates are generally required to implement the desired logic functions.

Also residing in the logic path is the inverting buffer mechanism 112. The inverting buffer mechanism 112 primarily serves as an inverter because in order to provide complete logic functionality in the mousetrap gate 100, it is necessary to have an inversion function in the critical logic path. Moreover, the inverting buffer mechanism 112 provides gain to the signal residing on line 114 and provides isolation between other potential stages of mousetrap gate components similar to the mousetrap logic gate components 102-106 of FIG. 1. The inverting buffer mechanism 112 is characterized by a high input impedance and low output impedance. Any buffer embodiment serving the described function as the buffer mechanism 112 is intended to be incorporated herein.

Furthermore, worth noting is that the arming mechanism 108, the ladder logic 110, and the inverting buffer mechanism 112 could in some implementations all reside on a single integrated circuit (IC), for example, an application specific integrated circuit (ASIC) or microprocessor chip.

2. Operation

The operation of the mousetrap logic gate 100 is described below at a high conceptual level in regard to only the mousetrap gate component 102 for simplicity. The narrowing of the present discussion is well grounded, because the various mousetrap gate components 102-106 are essentially redundant with the exception of their corresponding ladder logic functions implemented by ladder logics 110, 120, and 130. Consequently, the following discussion is equally applicable to the remaining mousetrap gate components 104 and 106.

In operation, upon excitation by a clock CK on the line 114, the arming mechanism 108 pulls up, or drives, the output 116 of the ladder logic 110 to a logic high. Concurrently, the arming mechanism 108 pulls the input at line 114 to the inverting buffer mechanism 112 to a logic high. Consequently, the corresponding vector component $O_O$ on a line 117 is maintained at a logic low, defined in the present invention as an invalid state. In the foregoing initial condition, the mousetrap logic gate 100 can be analogized as a "mousetrap," in the traditional sense of the word, which has been set and which is waiting to be triggered by the vector inputs I, J, ..., K.

The mousetrap logic gate 100 will remain in the armed predicament with the vector component $O_0$ in the invalid state, until being triggered by the ladder logic 110. The mousetrap logic gate 100 is triggered upon receiving enough valid vector inputs I, J, ..., K to definitively determine the correct state of the vector component $O_O$ on the line 117. In some designs of the ladder logic 110, not all of the vector inputs will need to be considered in order to produce an output signal on line 116, and hence, on line 117. The number of vector inputs I, J, ..., K needed to make the definitive determination of the output state and also the timing of the determination is defined by the content and configuration of the simple logic gates within the ladder logic 110.

After the vector component $O_O$ on line 117 is derived, it is passed onto the next stage (not shown) of logic. The mousetrap logic gate component 102 will not perform any further function until being reset, or re-armed, or refreshed, by the arming mechanism 108. In a sense, the timing from mousetrap gate component to mousetrap gate component as well as gate to gate depends upon the encoded data itself. In other words, the mousetrap gate components are "self-timed."

Mousetrap logic gates in accordance with the present invention directly perform inverting and non-inverting functions. Consequently, in contrast to conventional dynamic logic gates, mousetrap logic gates can perform multiplication and addition, which require logic inversions, at extremely high speeds.

Finally, it should be noted that the family of mousetrap logic gates 100 can be connected in electrical series, or cascaded, to derive a combinational logic gate which will perform logic functions as a whole. Thus, a mousetrap gate component, comprising an arming mechanism, ladder logic, and an inverting buffer mechanism, can be conceptualized as the smallest subpart of a mousetrap logic gate. Moreover, various mousetrap gate components can be connected in series and/or in parallel to derive a multitude of logic gates.

However, when mousetrap logic gates are chained together in long chains (perhaps, greater than two or three mousetrap gate components in series), precharging of the chains might require an undesirable lengthy amount of time. The reason is that mousetrap gate components will not be able to pull their output low (invalid) until their input is pulled low. The result is that the mousetrap gate components will charge in sequence from the first to the last in the chain, thereby undesirably slowing the precharge of the overall chain. Hence, a way is needed to cause the mousetrap gate components of a chain to precharge in parallel, not in sequence.

Parallel precharging can be accomplished several different ways. A preferred way is to provide a clock triggered n-channel MOSFET to disable the ladder logics 110, 120, and 130 of FIG. 1 during the precharging of the mousetrap gate components. In other words, a push-pull situation is implemented. The arming mechanism of a mousetrap gate component pulls (precharges) the input to the inverting buffer mechanism high, while the inserted n-channel MOSFET pulls the ladder logic low.

It should be noted that the n-channel MOSFET slightly slows the operation of the mousetrap gate component. However, it should be emphasized that the n-channel MOSFET need not be implemented for every mousetrap gate component. It need only be inserted every second or third mousetrap gate component in series. Moreover, in certain logic circuits, such as multiplication, the parallelism of the logic operation may be exploited to reduce the number of requisite n-channel MOSFETs.

The foregoing embodiment for providing parallel precharging has advantages. It requires little additional power dissipation. Moreover, it can, if desired, be uniformly applied to all mousetrap gate components for simplicity.

Another preferred way of providing for parallel precharging of mousetrap gate components chained in series is to periodically insert a mousetrap AND gate in the critical logic path. The mousetrap AND gate is inputted (1) an output vector component from a preceding mousetrap gate component and (2) the precharge clock. The output of the mousetrap AND gate is inputted to the next in series mousetrap gate component.

3. Inclusive OR Gate

Figure 2:
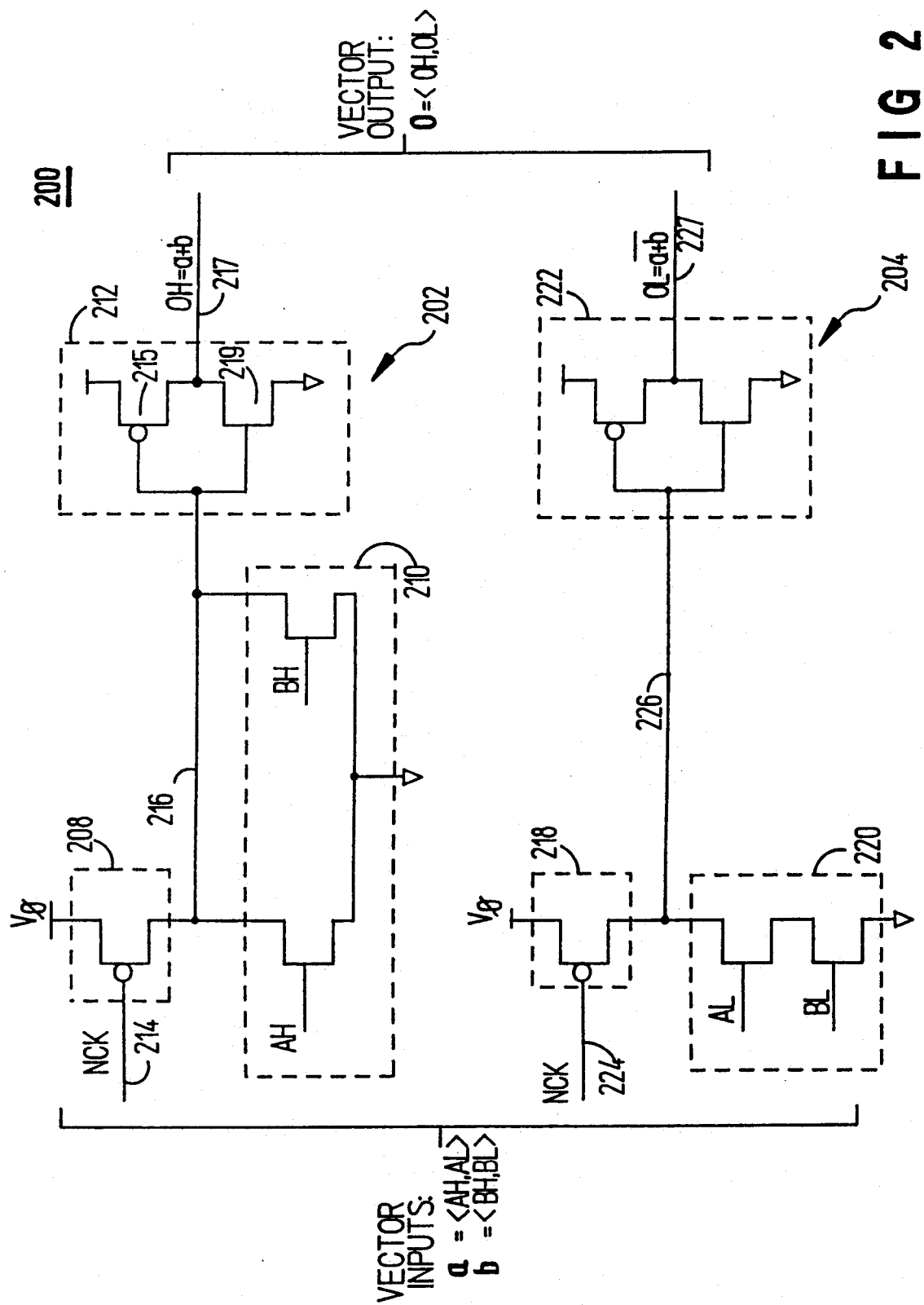
FIG. 2 illustrates a low level block diagram of a two-input inclusive OR mousetrap logic gate in accordance with FIG. 1.

FIG. 2 shows a low level block diagram of an example of a two-input inclusive OR mousetrap logic gate 200 in accordance with the present invention of FIG. 1. The inclusive OR mousetrap logic gate 200 can be used in a vector logic system having two logic states and one invalid logic state.

As shown, the inclusive OR mousetrap logic gate 200 has two mousetrap gate components 202 and 204. The mousetrap gate component 202 comprises an arming mechanism 208, ladder logic 210, and an inverting buffer mechanism 212. The mousetrap gate component 204 comprises an arming mechanism 218, ladder logic 220, and an inverting buffer mechanism 222. Note the similarity of reference numerals with regard to FIG. 1, as well as with the other figures to follow.

The inclusive OR mousetrap logic gate 200 and specifically, the arming mechanisms 208 and 218, is armed by command of a clock NCK ("N" denotes active at logic low) on respective lines 214 and 224. In the preferred embodiments of the present invention, the arming mechanisms 208 and 218 are p-channel metal-oxide-semiconductor field-effect transistors (MOSFET), as shown in FIG. 2, which are well known in the art and are commercially available. N-channel MOSFETs could be used instead of p-channel MOSFETs; however, the clocking obviously would be diametrically opposite.

With reference to FIG. 2, the MOSFETs comprising the arming mechanisms 208 and 218 essentially serve as switches to thereby impose a voltage V0 on respective lines 216 and 226 upon excitation by a low clock NCK signal on respective lines 214 and 224. As further known in the art, any type of switching element for voltage can be used.

Additionally, in the preferred embodiments, the simple logic in the ladder logics 210 and 220 is implemented with n-channel MOSFETs, as shown. The rationale for using n-channel MOSFETs is as follows. N-channel MOSFETs have superior drive capabilities, space requirements, and load specifications, than comparable p-channel MOSFETs. A typical n-channel MOSFET can generally switch approximately fifty percent faster than a comparable p-channel MOSFET having similar specifications.

Furthermore, in the preferred embodiments, the inverting buffer mechanisms 212 and 222 are static CMOSFET inverters, as shown in FIG. 2, which are well known in the art and are commercially available. A CMOSFET inverter is utilized for several reasons. As stated previously, an inversion must take place in the critical logic path in order to provide functional completeness. The inversion which must take place in the critical path can be accomplished by cleverly manipulating the design (gain) of a conventional CMOSFET inverter, which comprises both a p-channel MOSFET pull-up 215 and an n-channel MOSFET pull-down 219. In other words, because of the known existence of a monotonic progression, the ratio of the widths of the MOSFET gates can be designed to favor switching in one direction [i.e,, either high (1) to low (0) or low (0) to high(1)], at the expense of the other direction.

Specifically, in the particular CMOSFET inverter envisioned by the present invention, the gate width of the constituent p-channel MOSFET 215 is made wider than the gate width of the constituent n-channel MOSFET 219. Consequently, the CMOSFET inverter output switches very quickly from a logic low (0; the armed state of the mousetrap) to a logic high (1; the unarmed state of the mousetrap). The speed of the CMOSFET inverter output switching from a logic high to a logic low does not matter because the mousetrap gate 200 is precharged during this time period. Hence, the mousetrap logic gate 200 can be constructed to exhibit superior performance and size specifications in one direction, to thereby tremendously increase the speed of data transfer and reduce the size specifications of the mousetrap logic gate 200.

With respect to operation, a truth table for the inclusive OR mousetrap logic gate 200 is set forth in Table A hereinafter.

TABLE A

| a | b | o | AH | AL | BH | BL | OH | OL |
|---|---|---|----|----|----|----|----|----|
| inv | inv | inv | 0 | 0 | 0 | 0 | 0 | 0 |
| inv | 0 | inv | 0 | 0 | 0 | 1 | 0 | 0 |
| 0 | inv | inv | 0 | 1 | 0 | 0 | 0 | 0 |
| 1 | x | 1 | 1 | 0 | x | x | 1 | 0 |
| x | 1 | 1 | x | x | 1 | 0 | 1 | 0 |

In the above Table A, "x" denotes a an irrelevant or "don't care" situation, "inv"denotes an invalid logic state, "1" denotes a high logic state; and "0" denotes a low logic state.

As indicated in Table A and shown in FIG. 2, a vector input a and a vector input b are operated upon by the inclusive OR mousetrap logic gate 200 to derive a vector output O. For discussion purposes, it is worth noting that vector input a, vector input b, and vector output O could correspond respectively with vector input I, vector input J, and vector output O of FIG. 1.

Vector input a specifies a vector logic state defined by two vector components AH and AL. Vector input b specifies a vector logic state defined by two other vector components BH and BL. Vector output 0 specifies a vector logic state defined by two vector components OH and OL, which collectively describe the inclusive disjunction (OR function) of vector inputs a and b. In vector notation, as shown, a=<AH,AL>; b=<BH,BL>; and O=<OH,OL>=a+b.

4. Add Predecoder Gate

Figure 3:
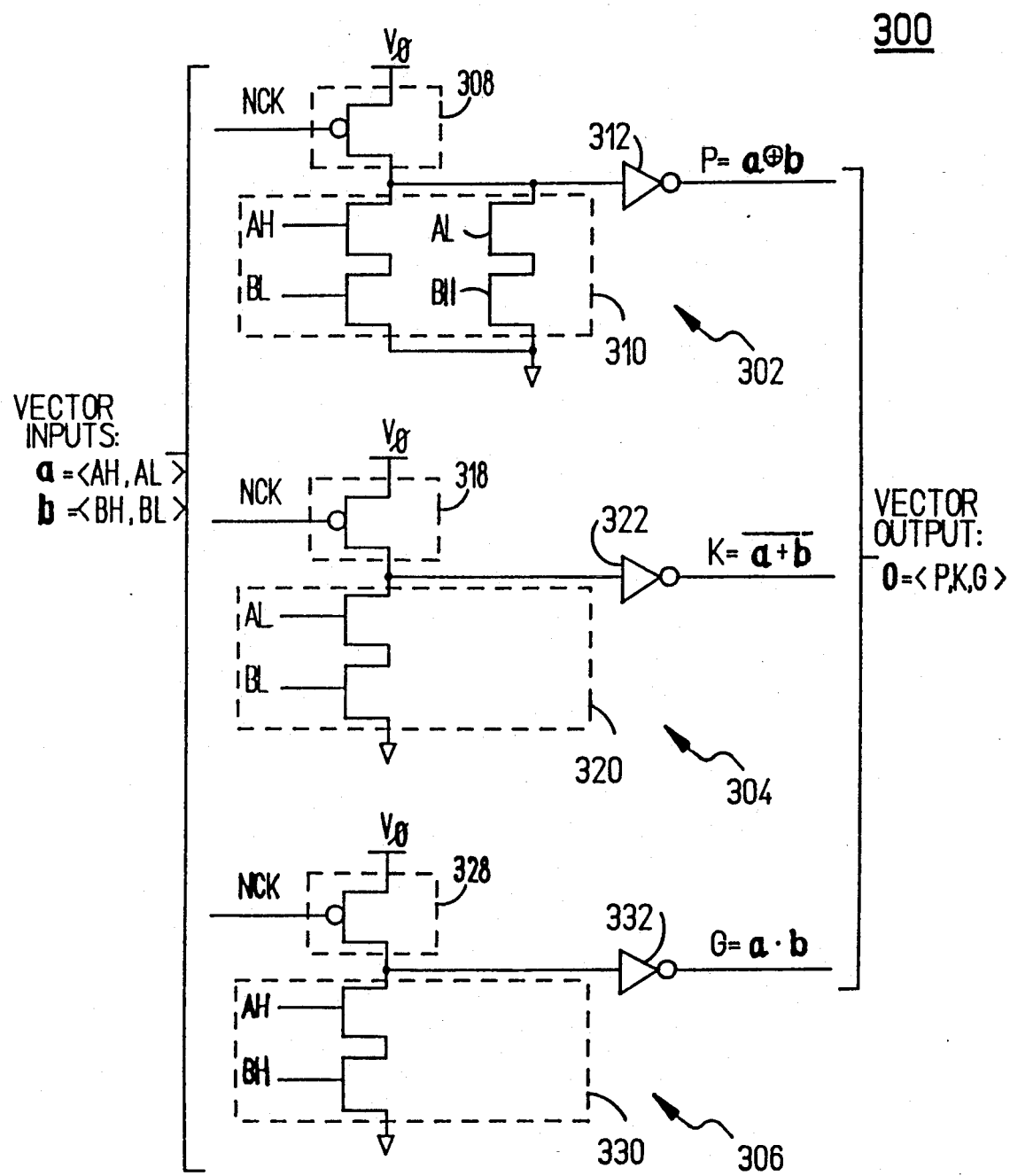
FIG. 3 illustrates a low level block diagram of a two-input add predecoder mousetrap logic gate in accordance with FIG. 1.

FIG. 3 shows a low level block diagram of a two-input add predecoder mousetrap logic gate 300 in accordance with the present invention of FIG. 1. Well known in the art, a predecoder is logic primarily used in the arithmetic logic unit (ALU) to perform arithmetic functions, especially addition. Generally, a predecoder aids in parallel processing and facilitates control of a carry bit path.

As shown, the predecoder 300 has three mousetrap gate components 302-306. Respectively, the three mousetrap gates 302-306 comprise the following: (1) an arming mechanism 308, ladder logic 310, and a buffer 312; (2) an arming mechanism 318, ladder logic 320, and a buffer 322; and (3) an arming mechanism 328, ladder logic 330, and a buffer 332.

A truth table describing the operation of the add predecoder logic gate 300 is set forth in Table B hereinafter.

TABLE B

| a | b | o | AH | AL | BH | BL | P | K | G |
|---|---|---|----|----|----|----|---|---|---|
| inv | x | inv | 0 | 0 | x | x | 0 | 0 | 0 |
| x | inv | inv | x | x | 0 | 0 | 0 | 0 | 0 |
| 0 | 0 | kill | 0 | 1 | 0 | 1 | 0 | 1 | 0 |
| 0 | 1 | prop | 0 | 1 | 1 | 0 | 1 | 0 | 0 |
| 1 | 0 | prop | 1 | 0 | 0 | 1 | 1 | 0 | 0 |
| 1 | 1 | gen | 1 | 0 | 1 | 0 | 0 | 0 | 1 |

Similar to the inclusive OR mousetrap logic gate 200 of FIG. 2, vector input a specifies a vector logic state defined by two vector components AH and AL. Vector input b specifies a vector logic state defined by two other vector components BH and BL. However, in contrast to the mousetrap logic gate of FIG. 2, vector output O specifies a vector logic state defined by three vector components P, K, and G, discussed in detail below. In vector notation, as shown, a=<AH,AL>; b=<BH,BL>; and O=<P,K,G>.

Conventional predecoders are usually designed so that the output indicates only one of two logic states. In many implementations, the conventional predecoder indicates either that the carry should be "propagated" (designated by "P") or that the carry bit should be "killed" (designated by "K"). In other implementations, the predecoder indicates either that the carry should be "propagated" or that the carry bit should be "generated" (designated by "G").

In the present invention, as noted in Table B, the vector output O can indicate any of four logic states: an invalid state and three valid states, namely, kill, propagate, or generate.

Furthermore, the add predecoder logic gate 300 must perform an exclusive OR function as part of the overall predecoder function. Conventionally, dynamic logic gates could not implement the exclusive OR function because static hazards would cause logic errors. Static hazards occur in combinational logic configurations because of propagation delays. The mousetrap logic gates of the present invention are not adversely affected by static hazards, because of self-timing. No valid vector component output is present unless all the vector inputs, needed to definitively determine the output of the ladder logic, are valid as indicated in Table B.

5. Carry Propagate Gate

Figure 4:
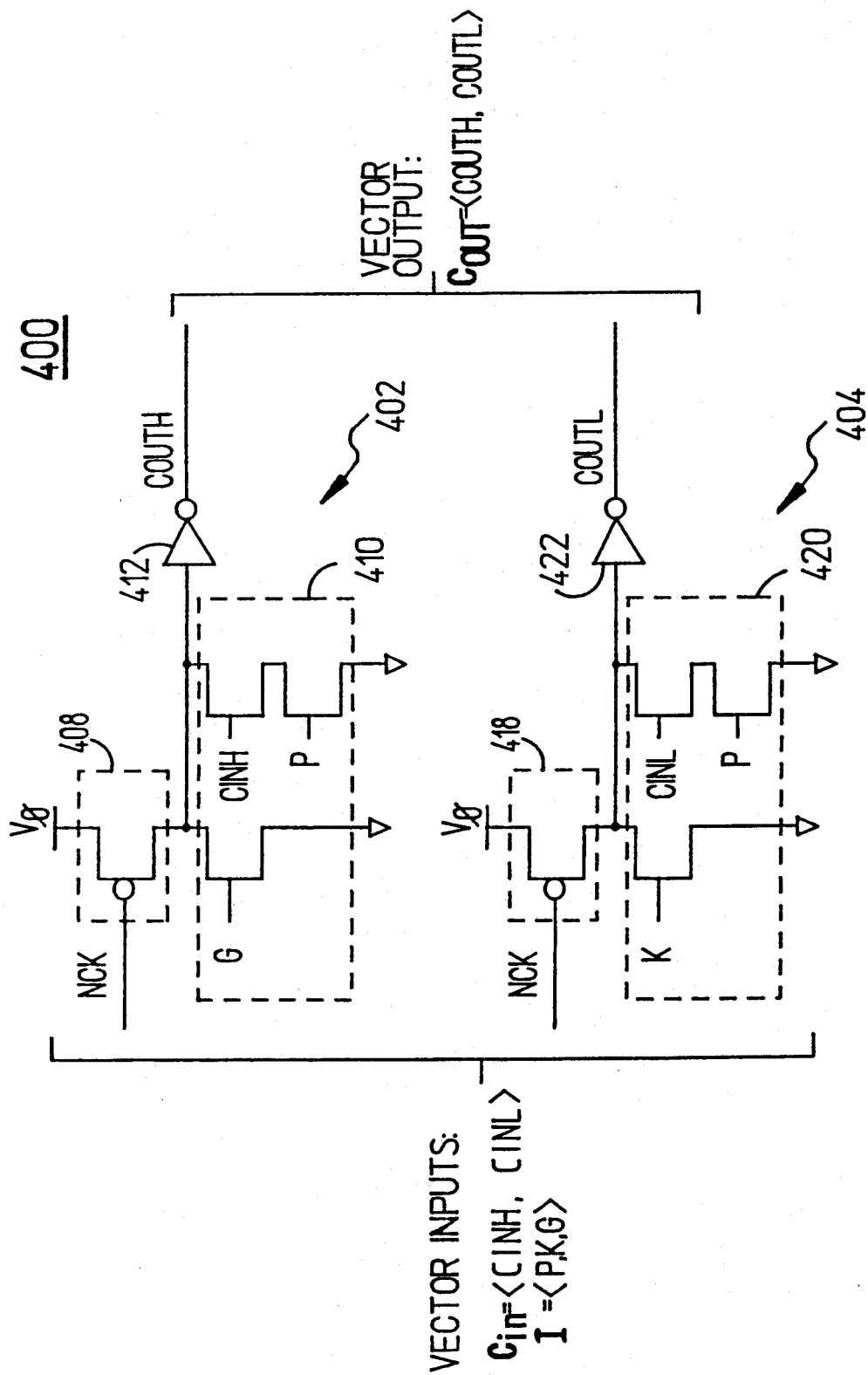
FIG. 4 illustrates a low level block diagram of a carry propagate mousetrap logic gate in accordance with FIG. 1 and for use series with the add predecoder mousetrap logic gate of FIG. 3.

FIG. 4 shows a low level block diagram of a carry propagate gate 400 in accordance with the present invention. Well known in the art, a carry propagate logic gate is oftentimes used in series with an add predecoder logic gate, as discussed previously, in order to control a carry bit path in an ALU. Specifically, the carry propagate gate 400 functions in series with the add predecoder logic gate 300 in the preferred embodiment to provide a high performance carry bit path.

The carry propagate gate 400 has two mousetrap gate components 402 and 404. The mousetrap gate component 402 comprises an arming mechanism 408, ladder logic 410, and an inverting buffer mechanism 412. The mousetrap gate component 404 comprises an arming mechanism 418, ladder logic 420, and an inverting buffer mechanism 422.

To further clarify the functionality of the carry propagate gate 400, a truth table for the carry propagate gate 400 is set forth in Table C hereinafter.

TABLE C

| I | CIN | COUT | P | K | G | CINH | CINL | COUTH | COUTL |
|---|---|---|---|---|---|---|---|---|---|
| inv | x | inv | 0 | 0 | 0 | x | x | 0 | 0 |
| x | inv | inv | x | x | x | 0 | 0 | 0 | 0 |
| kill | x | 0 | 0 | 1 | 0 | x | x | 0 | 1 |
| prop | 0 | 0 | 1 | 0 | 0 | 0 | 1 | 0 | 1 |
| prop | 1 | 1 | 1 | 0 | 0 | 1 | 0 | 1 | 0 |
| gen | x | 1 | 0 | 0 | 1 | x | x | 1 | 0 |

6. Shared Ladder Logic

Figure 5A:
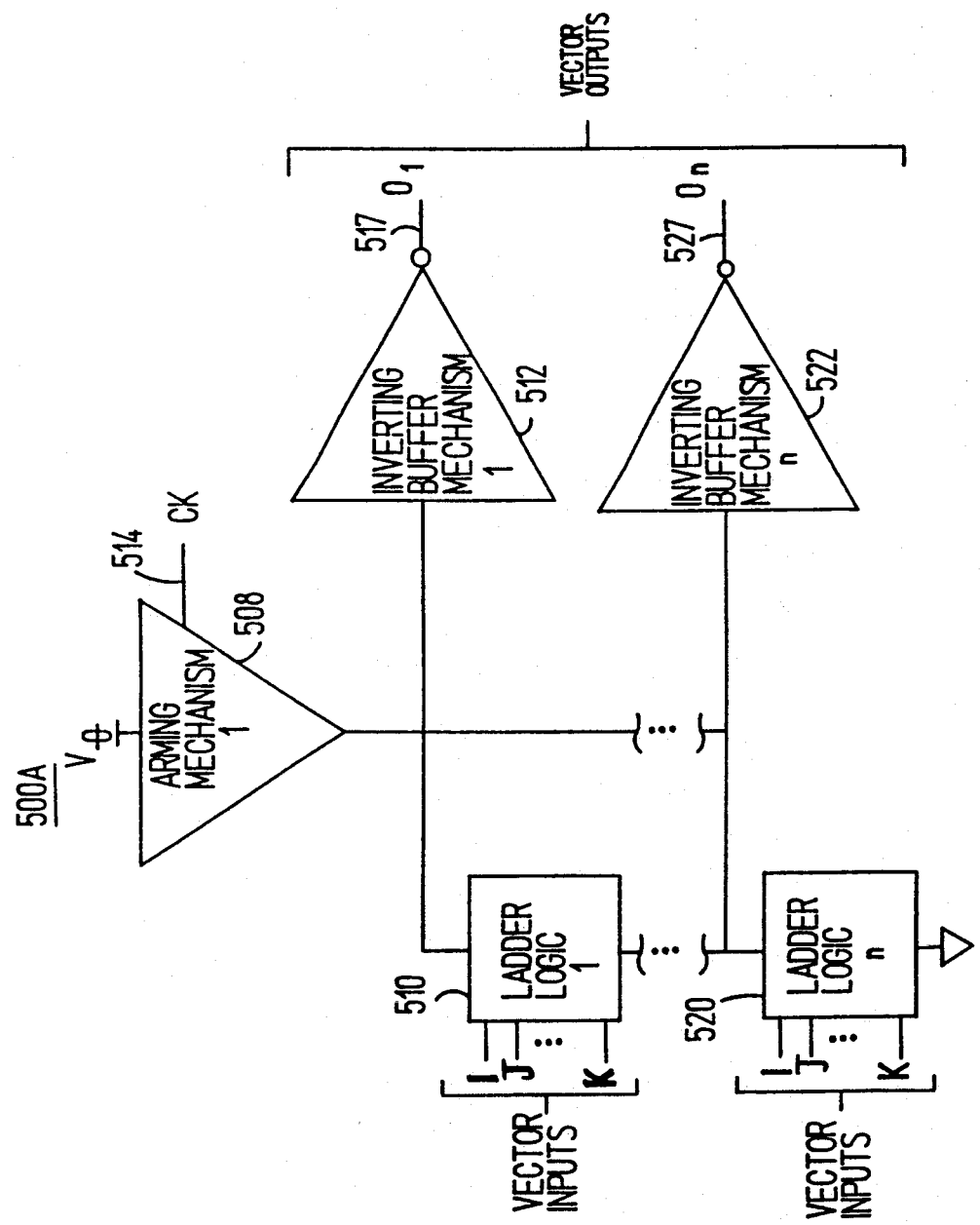
FIG. 5A illustrates a high level block diagram of a mousetrap logic gate having shared ladder logics.

FIG. 5A shows a high level block diagram of an embodiment of a mousetrap logic gate wherein the ladder logics 510-520 of any number n of mousetrap gate components have been combined in a single mousetrap logic gate 500A. The mousetrap logic gate 500A is inputted with a plurality of vectors I, J, . . . , K, and/or parts thereof. In turn, the gate 500A outputs a plurality of vector output components $<O_1-O_n>$, which can define vectors and/or partial vectors.

Essentially, the logic function which generated the vector component output $<O_n>$ is a subset of all logic functions deriving vector component outputs $<O_1>$ through $<O_{n-1}>$. More specifically, the vector component output $<O_1>$ is determined by ladder logics 510, 520, while the vector component output $<O_n>$ is determined by only ladder logic 520. As is obvious from FIG. 5A, this configuration saves hardware and cost. More outputs are derived with less ladder logic.

7. Exclusive OR Gates

A specific example of FIG. 5A is illustrated in FIG. 5B. FIG. 5B shows a low level block diagram of a three-input exclusive-OR (XOR) mousetrap logic gate 500B.

The exclusive OR mousetrap logic gate 500B can be used for high speed sum generation in either a full or half adder and does not suffer from any adverse effects from static hazards. Sum generation logic gates are well known in the art. They are especially useful in adder and multiplier logic circuits.

The exclusive OR logic gate 500 has two mousetrap gate components, having respective arming mechanisms 538 and 548 as well as inverting buffer mechanisms 532 and 542. However, as shown by a phantom block 550, the ladder logic associated with each of the two mousetrap gate components is not separated completely in hardware, but remains mutually exclusive in a logic sense. Hence, as a general proposition, because the ladder logic in each mousetrap gate component of a mousetrap logic gate uses the same type of gates, namely, n-channel MOSFETs, sometimes their logic functions can share the same hardware, thereby resulting in a less number of total gates and a reduction in utilized computer real estate.

A truth table indicating the operation of the exclusive OR logic gate 500B is set forth in Table D hereinafter.

TABLE D

| a | b | c | s | AH | AL | BH | BL | CH | CL | SH | SL |
|---|---|---|---|---|---|---|---|---|---|---|---|
| inv | x | x | inv | 0 | 0 | x | x | x | x | 0 | 0 |
| x | inv | x | inv | x | x | 0 | 0 | x | x | 0 | 0 |
| x | x | inv | inv | x | x | x | x | 0 | 0 | 0 | 0 |
| 0 | 0 | 0 | 0 | 0 | 1 | 0 | 1 | 0 | 1 | 0 | 1 |
| 0 | 0 | 1 | 1 | 0 | 1 | 0 | 1 | 1 | 0 | 1 | 0 |
| 0 | 1 | 0 | 1 | 0 | 1 | 1 | 0 | 0 | 1 | 1 | 0 |
| 0 | 1 | 1 | 0 | 0 | 1 | 1 | 0 | 1 | 0 | 0 | 1 |
| 1 | 0 | 0 | 1 | 1 | 0 | 0 | 1 | 0 | 1 | 1 | 0 |
| 1 | 0 | 1 | 0 | 1 | 0 | 0 | 1 | 1 | 0 | 0 | 1 |
| 1 | 1 | 0 | 0 | 1 | 0 | 1 | 0 | 0 | 1 | 0 | 1 |
| 1 | 1 | 1 | 1 | 1 | 0 | 1 | 0 | 1 | 0 | 1 | 0 |

As indicated in Table D and shown in FIG. 5B, vector input a specifies a vector logic state defined by two vector components AH and AL. Vector input b specifies a vector logic state defined by two other vector components BH and BL. Vector input c specifies a vector logic state defined by two vector components CH and CL. Furthermore, vector output s specifies a vector logic state defined by two outputs SH and SL. In vector notation, as shown, a=$<AH,AL>$; b=$<BH,BL>$; c=$<CH,CL>$; and s=$<SH,SL>$.

Figure 5C:
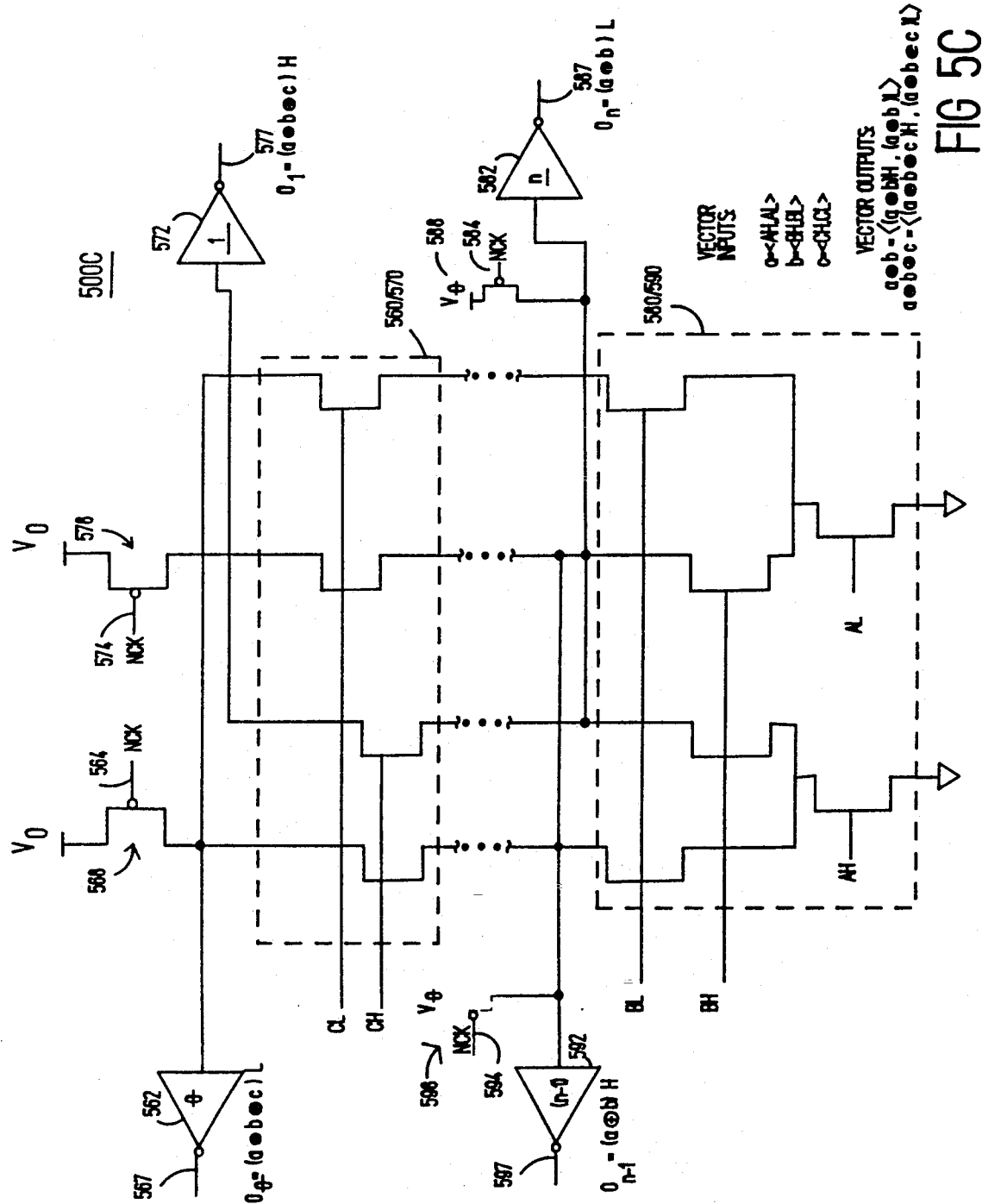
FIG. 5C illustrates a low level block diagram of a combined two-input/three-input exclusive OR mousetrap logic gate in accordance with FIG. 5A.

Another specific example of FIG. 5A is illustrated in FIG. 5C. FIG. 5C shows a low level block diagram of a three-input exclusive-OR (XOR) logic gate combined with a two-input exclusive-OR (XOR) logic gate. The input vectors are a=$<AH, AL>$, b=$<BH, BL>$, and c=$<CH, CL>$. Furthermore, the output vectors are the XOR logic function of vectors a and b, defined by vector component outputs $<O_O, O_1>$, as well as the XOR logic function of vectors a, b, and c, defined by vector component outputs $<O_{n-1}, O_n>$. The vector component outputs $<O_O, O_1>$ are determined by ladder logics 560-590 while the vector component outputs <$O_{n-1}$, $O_n$> are determined by only ladder logics 580, 590. Worth noting is that FIG. 5C illustrates a mousetrap logic gate having multiple vector inputs and multiple vector outputs.

II. Self-Timed Clocking System of the Present Invention

A. First Embodiment

Figure 6:
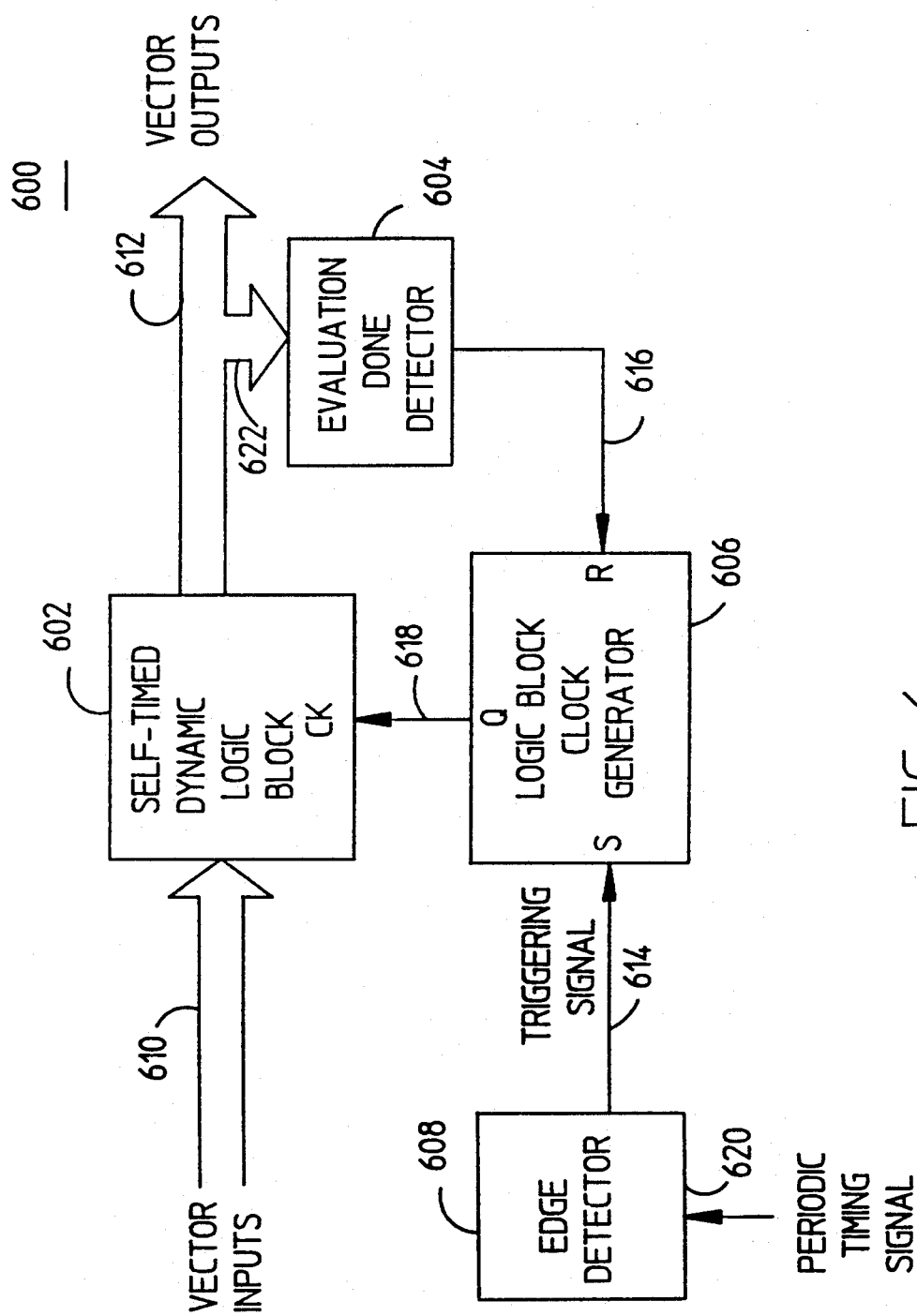
FIG. 6 illustrates a high level block diagram of the first embodiment of the present invention.

FIG. 6 illustrates a first embodiment of the present invention. As shown in FIG. 6, the first embodiment comprises a self-timed dynamic logic block 602, an evaluation done detector 604, a logic block clock generator 606, and an optional edge detector 608. The present invention implements a self-timed clocking system and method so as to more fully exploit the self-timed nature of the dynamic logic block 602. In essence, the evaluation done detector 604 detects completion of the logic evaluations performed by the self-timed dynamic logic block 602 in order to immediately initiate another precharge period without having to wait for another clock edge. Thus, precharge periods are provided to the self-timed dynamic logic block 602 in a self-timed manner.

The self-timed dynamic logic block 602 has any number of cascaded self-timed dynamic logic gates, for example, mousetrap logic gates 100. Moreover, the self-timed dynamic logic block 602 can comprise any number of cascaded logic branches. Stated another way, any number of vector inputs 610 can be operated on by the self-timed dynamic logic block 602 to derive any number of vector outputs 612.

Figure 7:
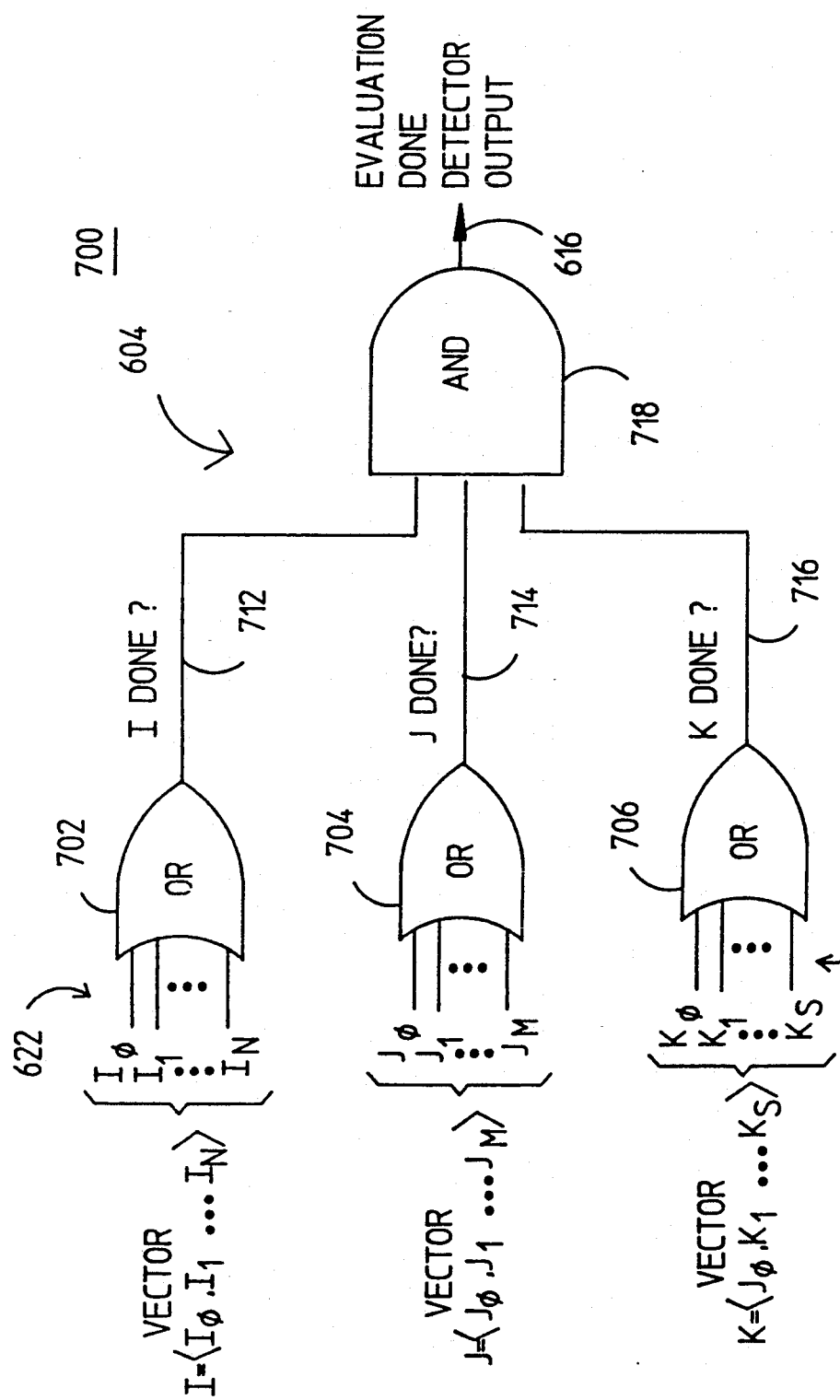
FIG. 7 illustrates a low level block diagram of the evaluation done detector of FIG. 6.

FIG. 7 shows a low level block diagram of the evaluation done detector 604. As shown in FIG. 7, each of the output vector components $I_O$-$I_N$, $J_O$-$J_M$, $K_O$-$K_S$ of respective output vectors I, J, K, for example, are operated upon by respective OR logic gates 702, 704, 706. The outputs of each of the OR logic gates 702-706 indicate whether the respective output vector has been received from the self-timed dynamic logic block 602, or in other words, whether the self-timed dynamic logic block 602 has completed its logic evaluation of the respective output vector I, J, K so that it is valid. Moreover, a logical AND operation is performed on the OR gate outputs 712-716 by an AND logic gate 718 in order to derive the evaluation done detector output 616 which reflects whether all vectors have been completely evaluated by the self-timed dynamic logic block 602.

In order to minimize the number of output vector components $I_O$-$I_N$, $J_O$-$J_M$, $K_O$-$K_S$ which must be considered at the input of the evaluation done detector 604, only a mere representative subset may be inputted into the OR gates 702-706 of the evaluation done detector 604. The representative subset should include those vector component paths which guarantee that all outputs have been evaluated and are valid. Consequently, the time consumption and real estate required by OR gates 702-706 may be minimized.

Referring back to FIG. 6, the logic block clock generator 606 can be a conventional flip-flop storage device in the preferred embodiment having a set (S) input for receiving the triggering signal 614, a reset (R) input for receiving the evaluation done detector output 616, and a generator output (Q) 618 directed to the self-timed dynamic logic block 602. The logic block clock generator 606 may also provide an inverted output (−Q; not shown), if desired, to the self-timed dynamic logic block 602.

The optional edge detector 608 of FIG. 6 generates the triggering signal 614 for the logic block clock generator 606. In essence, the edge detector 608 is a simple state machine in the preferred embodiment which provides a set signal 614 to the logic block clock generator 606 when either a rising or falling edge is detected in an inputted periodic timing signal 620. The periodic timing signal 620 is any arbitrary periodic signal. In the preferred embodiment, the periodic timing signal 620 is the system clock, and as a result, the vector output 612 is synchronous with the system clock. However, many other types of periodic timing signals, even those which are asynchronous to the system clock, can be utilized, as will be further discussed in regard to the second embodiment of the present invention. Finally, it should be emphasized that the edge detector 608 and its associated periodic timing signal 620 are merely optional and that other mechanisms can be employed to generate the triggering signal 614.

Figure 8:
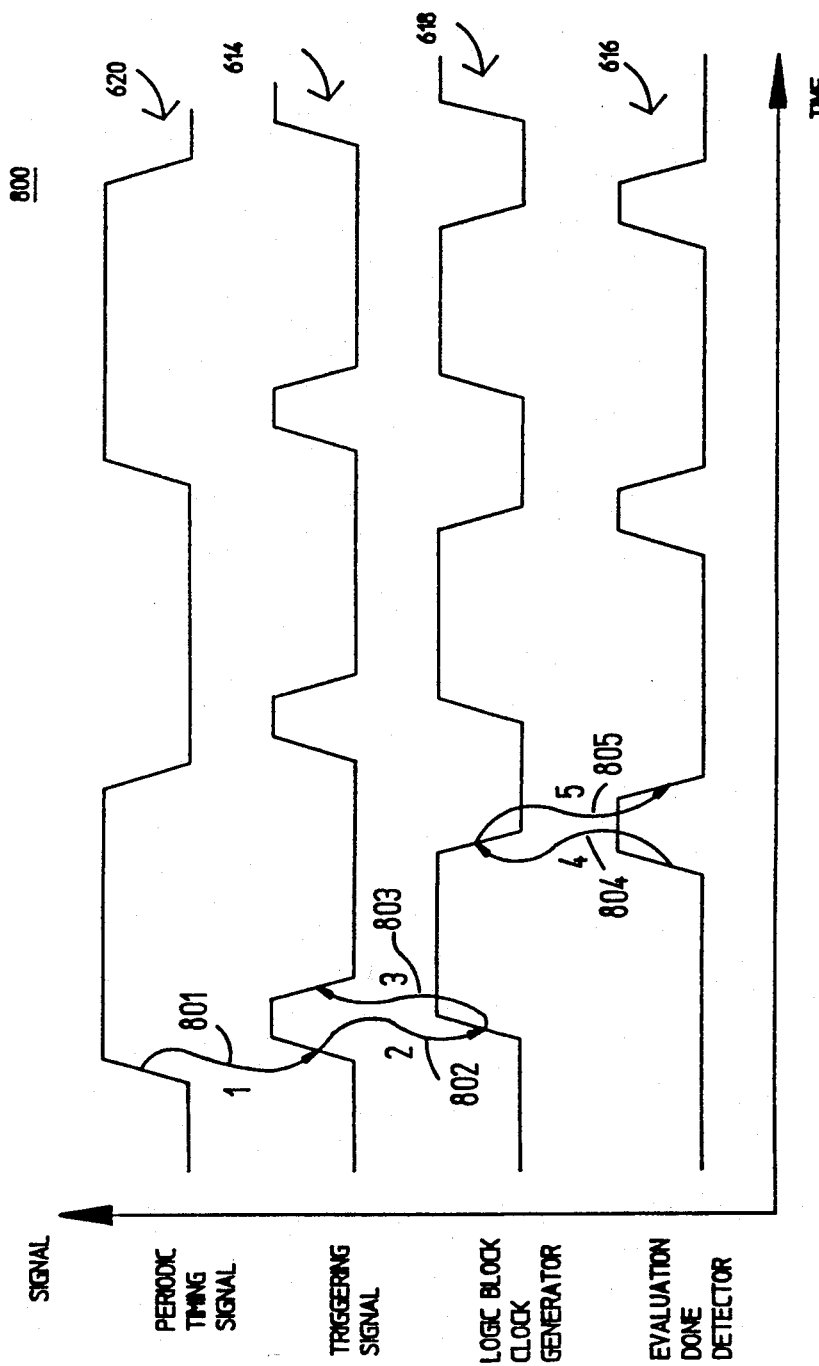
FIG. 8 illustrates a timing diagram of the first embodiment of FIG. 6.

The operation of the first embodiment shown in FIG. 6 will now be described by use of a timing diagram 800 shown in FIG. 8. With reference to FIG. 8, a periodic timing signal 620 having an approximate 50% duty cycle is illustrated as an example. As shown by a reference arrow 801 (Step 1), the rising edge of the periodic timing signal 620 causes the edge detector 608 to generate a triggering signal 614 which exhibits a logic high. This logic high causes the logic block clock generator 606 to provide a logic high clock signal 618 to the self-timed dynamic logic block 602, as indicated by a reference arrow 802 (Step 2). Moreover, the transition of the logic block clock signal 618 to a logic high clears the triggering signal 614 from the edge detector 608, as shown by a reference arrow 803 (Step 3).

Next, the self-timed dynamic logic block 602 is permitted to logically evaluate the vector inputs 610 so as to derive vector output 612. When the self-timed dynamic logic block 602 has completed its logic evaluations on the vector inputs 610, the evaluation done detector 604 will provide a logic high to the logic block clock generator 606, as indicated by an arrow 804 (Step 4) in FIG. 8. As a consequence, the logic block clock signal 618 is cleared.

Finally, after the logic block clock signal 618 transitions to a logic low (precharge), the evaluation done detector is cleared, as illustrated by a reference arrow 805 (Step 5). The clearing of the evaluation done detector 604 results because the precharging in the self-timed dynamic logic block 602 will force all of the vector outputs 612 to a logic low, or the invalid state.

As a result of using the system clock in the first embodiment, the self-timed dynamic logic block 602 is permitted to operate synchronously with and at twice the frequency of the system clock. However, the self-timed dynamic logic block 602 may be operated asynchronously with respect to the system clock and at much higher speeds as is described below in regard to the second embodiment of the present invention.

B. Second Embodiment

Figure 9:
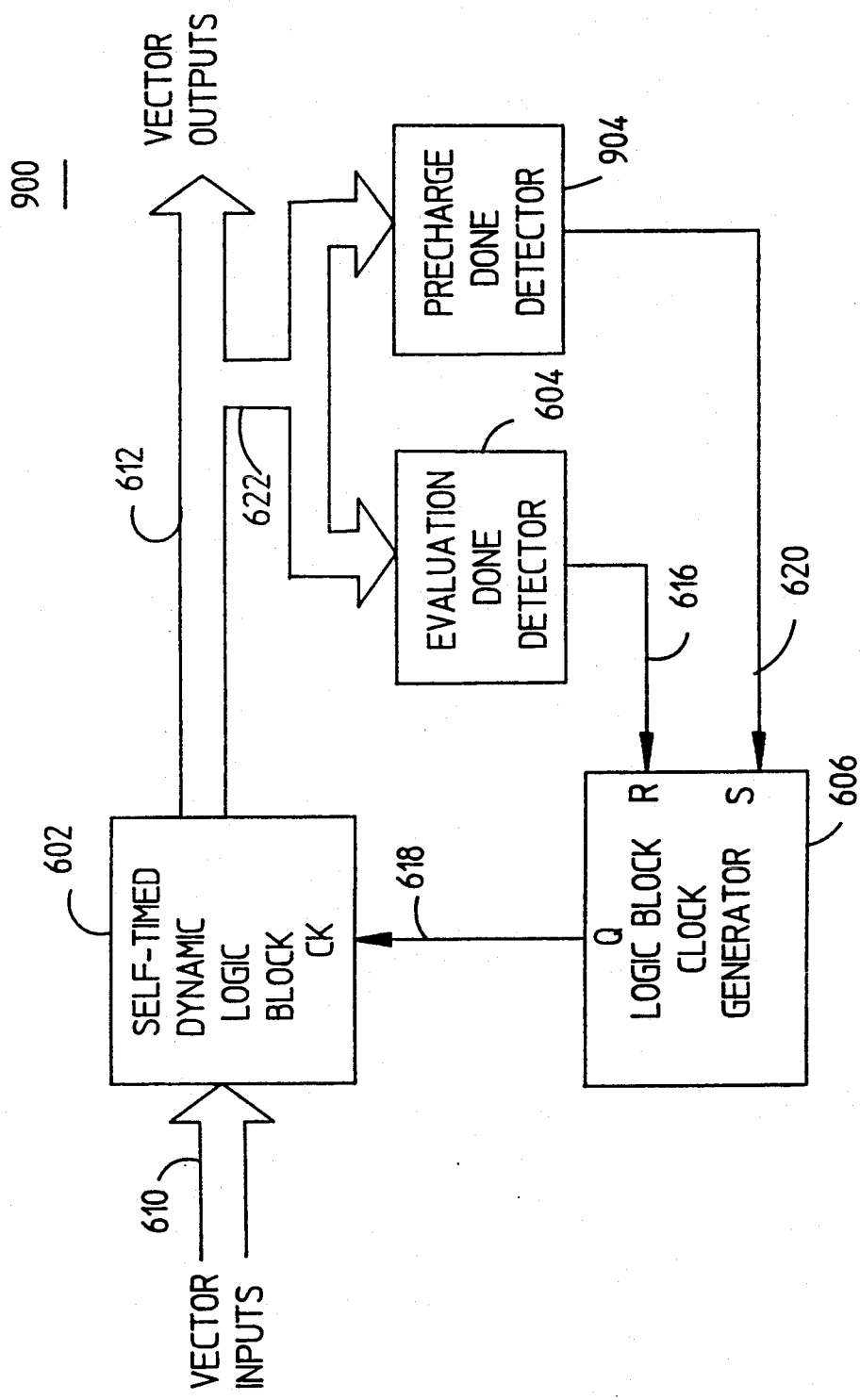
FIG. 9 illustrates a high level block diagram of the second embodiment of the present invention.

FIG. 9 shows a second embodiment of the present invention. In the second embodiment, a precharge done detector 904 is implemented to provide the triggering signal 620 for setting the logic block generator 606, as discussed in regard to the first embodiment. In essence, the precharge done detector 904 detects when the self-timed dynamic logic block 602 has completed its parallel precharge of the contained self-timed dynamic logic gates. After precharging, an evaluation period can be immediately commenced in the logic block 602. Thus, the second embodiment provides for a fully self-timed clocking scheme where both the evaluation period and the precharge period are self-timed events.

The precharge done detector 904 essentially parallels the architecture of the evaluation done detector as shown and described with respect to FIG. 7. However, it should be noted that the precharging of the self-timed dynamic logic block 602 occurs in parallel. In order to minimize the number of vector components $I_O$-$I_N$, $J_O$-$J_M$, $K_O$-$K_S$ which must be considered at the input of the precharge done detector 904, only a mere representative subset may be inputted into the OR gates 702–706 of the precharge done detector 904. The representative subset should include those vector component paths which expend the most amount of time to precharge. Consequently, the time consumption and real estate required by OR gates 702–706 may be minimized.

The foregoing description of the first and second embodiments of the present invention has been presented for purposes of illustration and description. It is not intended to be exhaustive or to limit the present invention to the precise forms disclosed, and obviously many modifications and variations are possible in light of the above teachings.

Wherefore, we claim the following inventions:

1. A system for enhancing the speed of logic evaluations through a series of cascaded self-timed dynamic logic gates, the system comprising:
   a logic block having cascaded dynamic logic gates which are precharged in parallel and which can collectively perform self-timed logic evaluations on vector inputs to derive a vector output;
   an evaluation done detector monitoring the output of said logic block and configured to determine when said vector output is valid;
   a logic block clock generator for outputting a clock signal which is set to a first logic level by a triggering signal and reset to a second logic level by said evaluation done detector, said logic block clock generator adapted to provide said clock signal to said logic block, said clock signal first logic level defining respective precharge periods, and said clock signal second logic level defining respective evaluation periods for said self-timed logic evaluations in said logic block.

2. The system of claim 1, further comprising an edge detector for generating said triggering signal by detecting the rising and falling edges of a periodic timing signal.

3. The system of claim 1, wherein said triggering signal comprises a waveform having an edge indicating the termination of said precharging periods.

4. The system of claim 1, further comprising a precharge done detector for providing said triggering signal, said precharge done detector configured to monitor the output of said logic block and configured to determine when said vector output is invalid.

5. The system of claim 1, further comprising a plurality of vector outputs and wherein said evaluation done detector comprises an OR logic gate for each of said vector outputs and an AND logic gate for collectively evaluating the OR logic gate outputs so as to determine when all said vector outputs are valid.

6. The system of claim 1 implemented in a mathematical circuit directed to division.

7. The system of claim 2, wherein said periodic timing signal is synchronous with a system clock.

8. The system of claim 2, wherein said periodic timing signal is asynchronous to a system clock.

9. A method for utilizing a self-timed dynamic logic block having precharge and evaluation periods at a rate which is faster than a system clock while maintaining synchronous operation with the system clock, comprising the steps of:
   (1) providing a triggering signal which is synchronous to the system clock; and
   (2) performing the following steps during a period of the system clock;
      (a) performing a first self-timed logic evaluation on a first vector input at the rising edge of said triggering signal;
      (b) generating a first precharge upon detecting the vector output as valid;
      (c) performing a second self-timed logic evaluation on a second vector input at the falling edge of said triggering signal; and
      (d) generating a second precharge upon detecting the second vector output as valid.

10. The method of claim 9, wherein said triggering signal is synchronous with a system clock.

11. The method of claim 9, wherein said triggering signal is asynchronous to a system clock.

12. The method of claim 9, wherein said triggering signal is generated by the detection of the completion of said first and second precharges.

13. A system for enhancing the speed of logic evaluations through a self-timed dynamic logic block having precharge and evaluation periods, the system comprising:
   a logic block having inputs and an output, said logic block having cascaded dynamic logic gates which are precharged during the precharge period and which performs a self-timed logic evaluation on said inputs to derive said output during the evaluation period;
   an evaluation done detector connected to said output, said evaluation done detector for determining when said logic block has completed said logic evaluation by sensing said output and for causing termination of said evaluation period; and
   means connected to said logic block and to said evaluation done detector, said means for receiving a periodic timing signal, said means for terminating said evaluation period and for commencing said precharge period by applying a precharge to said logic block after said logic block has completed said logic evaluation, said means for terminating said precharge period by terminating application of said precharge and for commencing said evaluation period at each change of logic state of said periodic timing signal.

14. The system of claim 13, wherein said periodic timing signal, said inputs, and said output are synchronous to a system clock and wherein said periodic timing signal exhibits a higher frequency than said system clock so that said system performs said logic evaluation faster than a period of said system block.

15. The system of claim 13, wherein said means comprises:
   an edge detector for receiving said periodic timing signal, for detecting rising and falling edges of said periodic timing signal, and for generating a triggering signal; and a logic block clock generator connected to said edge detector, to said logic block, and to said done detector, said logic block clock generator for receiving said triggering signal, for applying said precharge to said logic block after said logic block has completed said logic evaluation, and for terminating said precharge at each of said edges of said periodic timing signal.

16. The system of claim 13, wherein said logic block comprises a plurality of vector outputs and wherein said evaluation done detector comprises an OR logic gate for each of said vector outputs and an AND logic gate for collectively evaluating the OR logic gate outputs so as to determine when said evaluation period is complete.

17. The system of claim 13, further comprising a precharge done detector connected to said output, said precharge done detector for determining when said logic block have completed precharging by sensing said output and for generating said periodic timing signal.

18. The system of claim 15, wherein said logic block clock generator is a flip-flop, said triggering signal for setting said flip-flop, said done detector for resetting said flip-flop.

19. The system of claim 16, wherein each of said vector outputs is defined by greater than two logic paths.

20. A system for utilizing a self-timed dynamic logic block having precharge and evaluation periods at a rate which is twice as fast as a system clock while maintaining synchronous operation with the system clock, the system comprising:

a logic block having inputs and an output, said logic block having cascaded dynamic logic gates which are precharged during the precharge period and which performs a self-timed logic evaluation on said inputs to derive said output during the evaluation period;

an evaluation done detector connected to said output, said evaluation done detector for determining when said logic block has completed said logic evaluation by sensing said output and for causing termination of said evaluation period; and means connected to said logic block and to said evaluation done detector, said means for receiving the system block, said means for terminating said evaluation period and for connecting said precharge period by applying a precharge to said logic block after said logic block has completed said logic evaluation, said means for terminating said precharge period by terminating application of said precharge and for commencing said evaluation period at each change of logic state of said system clock.

21. The system of claim 20, wherein said means comprises:

an edge detector for receiving said system clock, for detecting rising and falling edges of said system clock, and for generating a triggering signal; and a logic block clock generator connected to said edge detector, to said logic block, and to said done detector, said logic block clock generator for receiving said triggering signal, for applying said precharge to said logic block after said logic block has completed said logic evaluation, and for terminating said precharge at each of said edges of said system clock.

22. The system of claim 20, wherein said logic block comprises a plurality of vector outputs and wherein said evaluation done detector comprises an OR logic gate for each of said vector outputs and an AND logic gate for collectively evaluating the OR logic gate outputs so as to determine when said evaluation period is complete.

23. The system of claim 20, further comprising a precharge done detector connected to said output, said precharge done detector for determining when said logic block have completed precharging by sensing said output and for generating said system clock.

24. The system of claim 20, wherein said logic block clock generator is a flip-flop, said triggering signal for setting said flip-flop, said done detector for resetting said flip-flop.

25. The system of claim 22, wherein each of said vector outputs is defined by greater than two logic paths.

26. A method for enhancing the speed of logic evaluations through a self-timed dynamic logic block having inputs and an output and having precharge and evaluation periods, the method comprising the steps of:

receiving a periodic timing signal;

terminating said precharge period and commencing said evaluation period at each change of logic state of said periodic timing signal;

performing a self-timed logic evaluation on the inputs to derive the output during said evaluation period;

detecting when said evaluation is complete by monitoring the output; and terminating said evaluation period and connecting application of a precharge to the logic block after detecting completion of said logic evaluation.

27. The method of claim 26, further comprising the step of performing logic evaluations with said logic block at twice the speed of the system clock.

28. A method for utilizing self-timed dynamic logic block having precharge and evaluation periods at a rate which is twice the speed of a system clock while maintaining synchronous operation with the system clock, the method comprising the steps of:

receiving the system clock;

terminating said precharge period and commencing said evaluation period at each change of logic state of said system clock;

performing a self-timed logic evaluation on the inputs to derive the output during said evaluation period;

detecting when said evaluation is complete by monitoring the output; and terminating said evaluation period and commencing application of a precharge to the logic block after detecting completion of said logic evaluation.

29. The method of claim 28, further comprising the step of performing logic evaluations with said logic block at twice the speed of the system clock.

* * * * *